United States Patent
Fabiano et al.

(10) Patent No.: US 9,543,995 B1
(45) Date of Patent: Jan. 10, 2017

(54) ANALOG FRONT END RECEIVERS WITH RESONANT MIXER CONFIGURED TO REJECT LOCAL OSCILLATOR HARMONICS

(71) Applicant: Marvell International Ltd., Hamilton (BM)

(72) Inventors: Ivan Fabiano, Pavia (IT); Marco Sosio, Pavia (IT); Antonio Liscidini, Toronto (CA); Rinaldo Castello, Arcore (IT)

(73) Assignee: Marvell International Ltd., Hamilton (BM)

( * ) Notice: Subject to any disclaimer, the term of this patent is extended or adjusted under 35 U.S.C. 154(b) by 233 days.

(21) Appl. No.: 14/173,563

(22) Filed: Feb. 5, 2014

Related U.S. Application Data

(60) Provisional application No. 61/761,057, filed on Feb. 5, 2013.

(51) Int. Cl.
  *H04B 1/28* (2006.01)
  *H04B 1/18* (2006.01)
  *H04B 1/12* (2006.01)
  *H04B 1/04* (2006.01)
  *H04B 1/00* (2006.01)
  *H03D 7/14* (2006.01)

(52) U.S. Cl.
  CPC .............. *H04B 1/12* (2013.01); *H03D 7/1466* (2013.01); *H03D 7/1475* (2013.01); *H04B 1/0071* (2013.01); *H04B 1/0475* (2013.01); *H04B 1/18* (2013.01); *H04B 1/28* (2013.01)

(58) Field of Classification Search
  CPC ......... H04B 1/0071; H04B 1/28; H04B 1/006; H04B 1/18; H04B 1/48; H04B 1/0003; H04B 1/04; H04B 1/0475; H04B 1/26; H03D 7/1458; H03D 7/1466; H03D 7/165; H03D 7/1441; H03D 2200/0082; H03D 2200/0088; H03D 7/125; H03D 7/1483; H03D 9/0633; H03D 2200/009; H03D 7/1475; H03H 19/004
  USPC .............................................. 455/118, 127.4
  See application file for complete search history.

(56) References Cited

U.S. PATENT DOCUMENTS

| | | | |
|---|---|---|---|
| 7,809,349 B1 * | 10/2010 | Granger-Jones | H04B 1/28 455/320 X |
| 2005/0164669 A1 * | 7/2005 | Molnar | H03D 7/1441 455/320 |
| 2013/0059556 A1 * | 3/2013 | Molnar | H04B 1/18 455/234.1 |
| 2015/0091646 A1 * | 4/2015 | Shifrin | H03F 3/21 330/255 |

* cited by examiner

*Primary Examiner* — Philip Sobutka

(57) ABSTRACT

Some of the embodiments of the present disclosure provide a receiver comprising a class AB common-gate transformer-based low noise transconductance amplifier (LNT) configured to receive an electromagnetic signal, a passive resonant mixer electrically connected to (i) an output port of the class AB common-gate transformer-based LNT and (ii) a local oscillator. The passive resonant mixer can be configured to reject at least one harmonic of the local oscillator. The receiver also comprises a base-band module electrically connected to an output port of the passive resonant mixer.

17 Claims, 5 Drawing Sheets

US 9,543,995 B1

ANALOG FRONT END RECEIVERS WITH RESONANT MIXER CONFIGURED TO REJECT LOCAL OSCILLATOR HARMONICS

CROSS REFERENCE TO RELATED APPLICATIONS

This claims priority to U.S. Provisional Patent Application No. 61/761,057, filed on Feb. 5, 2013, which is incorporated herein by reference.

TECHNICAL FIELD

Embodiments of the present disclosure relate to electronic transceivers, and more particularly, to wireless analog architectures.

BACKGROUND

Unless otherwise indicated herein, the approaches described in this section are not prior art to the claims in the present disclosure and are not admitted to be prior art by inclusion in this section.

The complexity, size, and cost of modern wireless terminals, such as cellular transceivers (e.g., smart phones), is becoming increasingly dominated by a large number of passive components. For example, duplexers, SAW filters, and high Q filters are generally used to discriminate relatively weak desired signals among relatively large interfering signals. Another aspect of modern wireless terminals is the use of differential inputs to increase immunity to spurious signals that could undesirably couple into a signal path. Such differential inputs can increase pin counts of electrical components and complicate board design.

SUMMARY

In various embodiments, the present disclosure provides a receiver comprising a class AB transformer-based low-noise amplifier (LNA) configured to receive an electromagnetic signal, a passive resonant mixer electrically connected to (i) an output port of the LNA and (ii) a local oscillator divider. The passive resonant mixer can be configured to reject at least one harmonic of the local oscillator. The receiver also comprises a base-band module electrically connected to an output port of the passive resonant mixer. In some implementations, the class AB transformer-based LNA can comprise a single-ended input transformer, and the electromagnetic signal can comprise a time-division-duplexing-based signal. In other implementations, the class AB transformer-based LNA can comprise a differential-input transformer, and the electromagnetic signal can comprise a frequency-division-duplexing-based signal. The base-band module can comprise a Rauch filter. The class AB transformer-based LNA, through the transformer, can be configured to reject a $3^{rd}$ harmonic of the local oscillator. The low-power divider local oscillator circuit can be configured to operate at a 25% duty cycle.

In other embodiments, a circuit is configured to operate on (i) time-division-duplexing-based electromagnetic signals and (ii) frequency-division-duplexing-based electromagnetic signals, wherein the circuit does not include a surface acoustic wave (SAW) amplifier, and wherein the circuit comprises: a single-ended input class AB transformer-based LNA configured to receive the time-division-duplexing-based electromagnetic signals; a differential-input class AB transformer-based LNA configured to receive the frequency-division-duplexing-based electromagnetic signals; a first resonant mixer electrically connected to (i) an output port of the single-ended input class AB transformer-based LNA and (ii) a local oscillator; a second resonant mixer electrically connected to (i) an output port of the differential-input class AB transformer-based LNA and (ii) the local oscillator; and a base-band module electrically connected to (i) an output port of the first resonant mixer and (ii) an output port of the second resonant mixer.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

Figure 1:
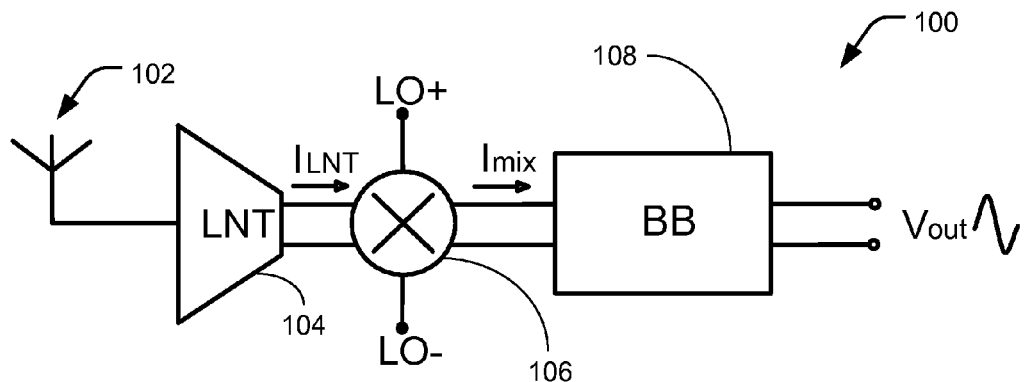
FIG. 1 is a block diagram of a receiver portion of a transceiver, according to some embodiments.

Wireless transceivers often use external surface acoustic wave (SAW) filters to attenuate out-of-band signals before these signals reach the transceiver's low-noise amplifier input. For time division duplexing (TDD) transceivers, which can be used for global systems for mobile communications (GSM), isolation between a transmitter (TX) and a receiver (RX) is generally provided by a transmitter/receiver (T/R) switch and not by a SAW filter. Therefore, a SAW filter does not need to be included in a TDD receiver if the receiver can tolerate moderately large interfering signals (e.g. 0 dBm, 20 MHz away for GSM) without degrading the dynamic range of the receiver.

On the other hand, for frequency division duplexing (FDD) transceivers, which can be used for wideband code division multiple access (W-CDMA), a SAW filter often performs both filtering and duplexing. Thus, it can be difficult to eliminate the SAW filter without incurring a performance penalty. For example, an FDD transceiver that does not include a SAW filter (duplexer or diplexer) tends to have a relatively high noise figure (NF). This can lead to reduced sensitivity at an antenna of the receiver. Thus, it is desirable to design an FDD transceiver that includes a SAW filter while minimizing the transceiver NF. Cost and complexity of circuit boards of a transceiver can be reduced by excluding SAW filters from a transceiver.

Example embodiments herein include transceivers that are able to operate with single-ended input signals and that do not include any SAW filters in the signal paths of the transceivers. Other example embodiments include transceivers having a similar architecture as the transceivers for single-ended input signals, but are able to operate with differential-input signals.

In some transceivers, SAW filters perform a conversion from a differential-input to a single-ended input. In other transceivers, such SAW filters can be eliminated by connecting a single-ended input receiver to an antenna (via a T/R switch). Eliminating SAW filters in this fashion can provide a number of benefits, such as reducing cost, complexity, and form-factor of circuitry of a transceiver, while improving its sensitivity. As another benefit, since SAW filters are RF filters that operate with a fixed frequency, eliminating their use may lead to an opportunity to use a single wide-band receiver in place of multiple narrow-band receivers. As yet another benefit, since SAW filters tend to attenuate signals, eliminating their use may lead to a desirable increase in NF by several decibels (dBs) for a given signal sensitivity.

On the other hand, designing transceivers sans SAW filters presents a number of challenges. For example, without RF filtering provided by SAW filters, undesirable effects may be exacerbated. Such effects include, for example, gain compression, intermodulation, reciprocal mixing, harmonic mixing, and noise folding. Gain compression can occur with the presence of a continuous-wave (CW) blocker (e.g., an interfering signal) in the input signal spectrum, due to limited current range (slewing) and limited voltage range (clipping) at the RF transceiver section and/or at a base band transceiver section, thus leading to desensitization of the receiver. Gain compression can also include two or more out-of-band interferers (e.g., interfering signals) that generate an intermodulation product that falls in-band. Thus, it is desirable for a blocker-tolerant receiver to include an amplifier having a relatively low transconductance (to avoid slewing) and a relatively small voltage gain throughout the RX chain (to avoid clipping), while maintaining high sensitivity to input signals (low noise). Furthermore, it is desirable for the receiver to include a base band having a relatively large dynamic range (e.g., a ratio of the maximum amplitude of out-of-band signals to the in-band noise).

Reciprocal mixing can occur by undesirable down-conversion of local oscillator phase noise through a continuous-wave blocker received by the transceiver. Thus, to preserve the NF of the receiver without a SAW filter, local oscillator phase noise is reduced by an amount of filtering otherwise provided by a SAW filter. Harmonic mixing/noise folding can occur when down-conversion involves a process that multiplies an input signal by a square wave. For example, odd harmonics (for a differential topology) of a local oscillator frequency that is present in a square-wave clock can fold (down-convert in frequency) to the base band any input signal located at these harmonics. Thus, to reduce harmonic mixing/noise folding for a receiver without a SAW filter, local oscillator phase noise is reduced and a process of harmonic rejection mixing and/or filtering at local oscillator harmonics is implemented.

FIG. 1 is a block diagram of a receiver portion 100 of a transceiver, according to some embodiments. Receiver portion 100 does not include a SAW filter. Receiver portion 100 receives RF signals via an antenna 102. Generally, such RF signals include an input signal and one or more interfering signals, called interferers. A low-noise transconductance amplifier (LNT, i.e. LNA with transconductance gain) 104 receives RF signals from antenna 102. LNT 104 presents a low-impedance load to antenna 102. Such a load-impedance load can lead to relatively high linearity and desensitization of receiver portion 100 to RF signals. LNT 104 comprises a transformer-based class AB common-gate, which can have relatively low transconductance to reduce down-converted blocker current. The transconductance, denoted by $g_m$, is the ratio of current change at an output port of a circuit component (e.g., LNT 104 or a transistor therein) to voltage change at an input port of the circuit component. LNT 104, being a class AB transformer-based topology, allows voltage swings above supply voltage and below ground voltage, while maintaining relatively low noise biasing. Moreover, LNT 104 includes primary/secondary coils having small turn ratios to reduce voltage swings and provide current gain at the secondary coils. Reducing voltage swings at the source of input transistors in LNT 104 improves linearity, and current gain is achieved with little or no reduction in linearity. LNT 104 can be configured for differential input or for single-ended input.

Receiver portion 100 also includes circuitry comprising a passive resonant mixer 106, which allows receiver portion 100 to operate in current mode. For current-mode operation, a passive (e.g., not necessarily resonant) mixer can be included. For harmonic down-conversion and/or noise folding rejection a resonant mixer can be included. Resonant mixer 106 receives a current $I_{LNT}$ from LNT 104 and provides a modified current $I_{mix}$ to a base band module 108, which generates an output signal $V_{out}$. Resonant mixer 106 combines symmetric local oscillator frequencies, $f_{LO+}$ and $f_{LO-}$, with frequencies included in $I_{LNT}$.

Figure 2:
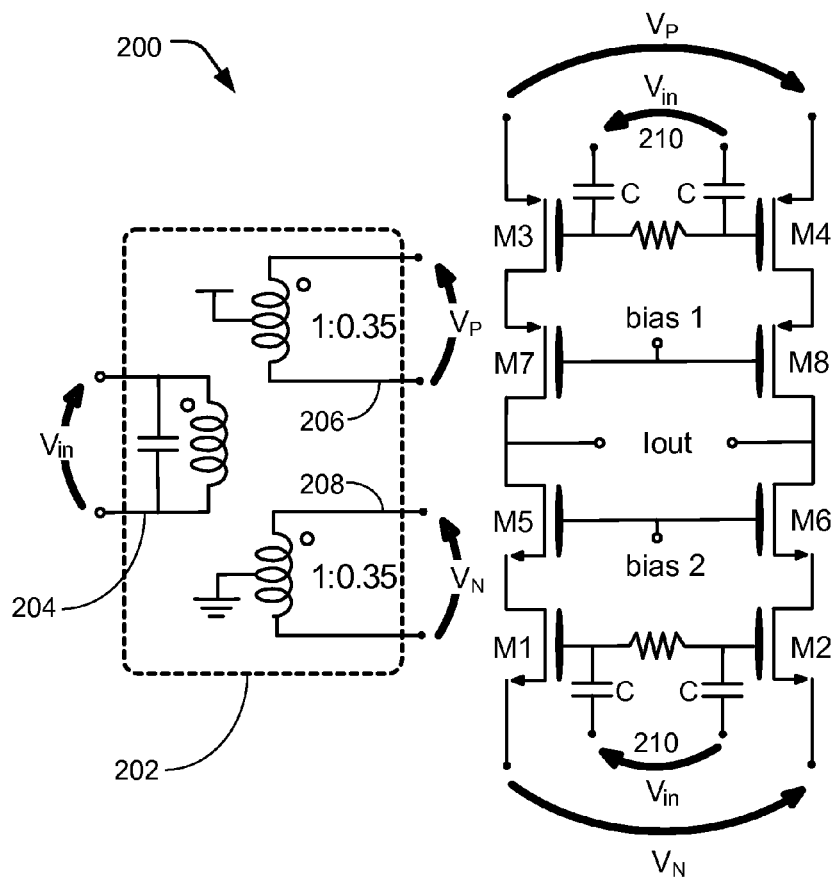
FIG. 2 is a schematic diagram of an LNT circuit configured for differential input, which is used for FDD input signals, according to some embodiments.

FIG. 2 is a schematic diagram of an LNT circuit 200, similar to LNT circuit 104, configured for differential input, which is used for FDD input signals, according to some embodiments. An integrated transformer 202 can be configured so that input current in primary coil 204 (with input $V_{in}$) is split at least approximately half-and-half between the two secondary coils 206 and 208 (with outputs $V_N$ and $V_P$) that have substantially the same inductance. Secondary coils 206 and 208 are labeled with the ratio "1:0.35" to indicate a winding ratio between primary coil 204 and secondary coils 206 and 208. While the input signal is not compressible, the output signals can compress if the LNT impedance load is too high. However, current-mode operation of LNT circuit 200 includes a relatively low impedance load that leads to a relatively high linearity/compression point. A common-gate topology is used for increased linearity, though it can undesirably lead to a high NF. To reduce noise, a passive gate boost is used. Applying a replica of the input voltage to gates of MOS transistors (indicated as M1, M2, etc.), the noise becomes 1+n times smaller than the noise of a classical common gate amplifier:

$$NF_{CG} = 1 + \gamma \qquad (1)$$

$$NF_{boost}=1+\gamma(1+n) \quad (2)$$

where $NF_{boost}$ and $NF_{CG}$ are the NFs with and without boost, γ is the MOS excess noise factor and n is the transformer ratio of the integrated transformer 202.

On the other hand, a larger gate voltage swing tends to degrade linearity. Thus, a trade-off between linearity and NF exists. LNT circuit 200 uses a fully differential signal path to reject common mode noise and a cascode stage (e.g., a transconductance amplifier followed by a current buffer) to improve output impedance for current-mode operation of a mixer, such as mixer 106 shown in FIG. 1. LNT circuit 200, being fully differential, is compatible with an external differential duplexer. Boosting can be accomplished using capacitors C connected to input pins 210, as shown in FIG. 2.

Figure 3:
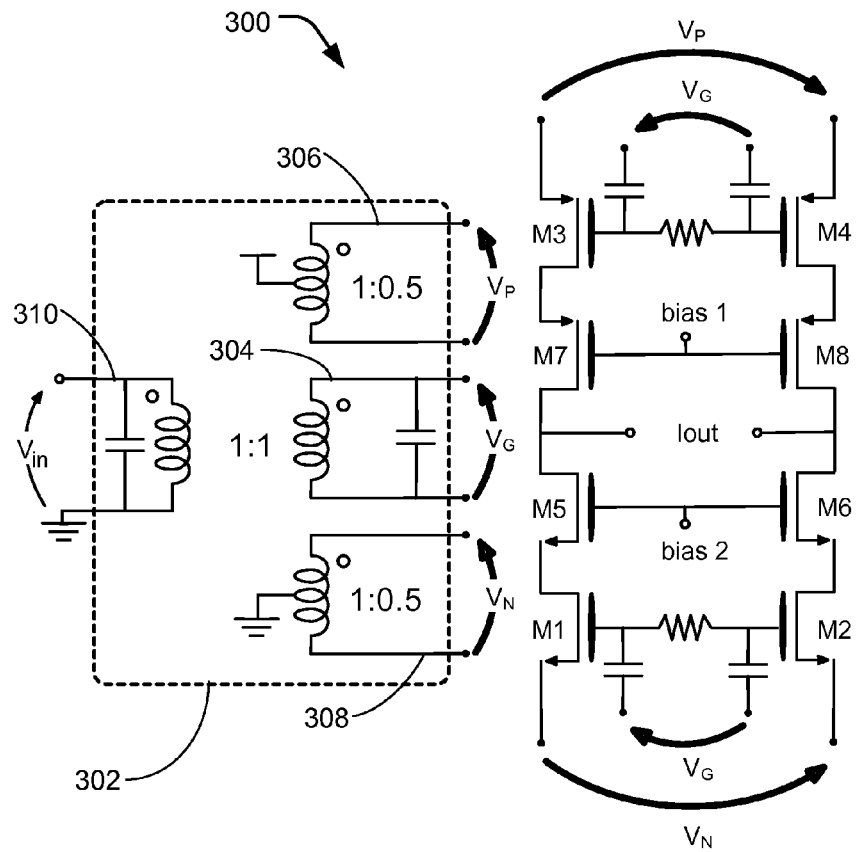
FIG. 3 is a schematic diagram of an LNT circuit configured for single-ended input, which is used for TDD input signals, according to some embodiments.

FIG. 3 is a schematic diagram of an LNT circuit 300 configured for single-ended input, which is used for TDD input signals, according to some embodiments. LNT circuit 300, being single-ended, can be directly connected to an antenna switch (e.g., a T/R switch, not shown). In this case, an integrated transformer 302 behaves like a balun to drive the fully differential signal path which is still present in 300. A balun is an electrical device that converts a balanced signal (two signals working against each other where ground is irrelevant, i.e. differential signal) and an unbalanced signal (a single signal working against ground or pseudo-ground, i.e. single-ended signal). With a single-ended input, a capacitive boost is not used, and a fourth coil 304 (with output $V_G$) is included in integrated transformer 302. Secondary coils 306 and 308 are labeled with the ratio "1:0.5" to indicate a winding ratio between primary coil 310 and secondary coils 306 and 308.

Figure 4:
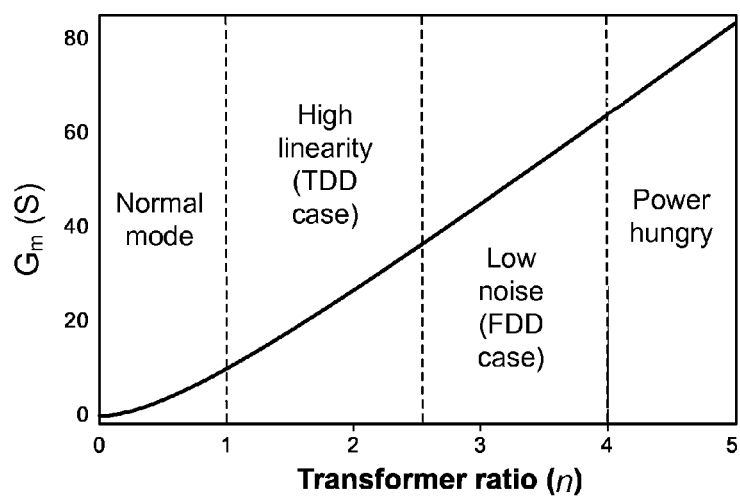
FIG. 4 is a plot of the transconductance of an LNT circuit as a function of transformer winding ratio, for some embodiments.

FIG. 4 is a plot of the transconductance $g_m$ of an LNT circuit (e.g., LNT circuit 200 or LNT circuit 300) as a function of transformer winding ratio n in a matching impedance condition (antenna to LNT impedance matching is required), for some embodiments. Four principle operating zones are distinguishable from one another: normal mode, high linearity, low noise, and power hungry zone. In the normal mode, boosting is relatively low so that behavior of the LNT circuit is similar to a classical common gate. In the power hungry zone, boosting, transconductance, and power consumption are relatively high. In the high linearity zone, linearity is relatively high because boosting is relatively low. Though noise is relatively high, an LNT circuit operating in the high linearity zone can be useful in a TDD receiver, where linearity is the key concern. On the other hand, the low noise zone sacrifices linearity to achieve a better NF. This zone is beneficial for FDD receivers, such as those used for UMTS, where a duplexer circuit filters out interferers while providing signal attenuation, which effectively amplifies the receiver noise.

In some embodiments, an amount of boosting for LNT circuits 200 and 300 depends, at least in part, on the ratio n of integrated transformers 202 and 302, respectively. On the other hand, for a matching condition of LNT circuits 200 and 300, transconductance $g_m$ of individual input MOS transistors of LNT circuits 200 and 300 is constrained to be:

$$g_m=n^2/[R_s(1+n)] \quad (3)$$

where $R_s$ is the characteristic antenna impedance (that has to be matched by LNT impedance) and is typically named source resistance.

In some embodiments, physical aspects of integrated transformers 202 and 302 are considered in both fully-differential and single-ended LNT circuits 200 and 300, since integrated transformers 202 and 302 play an important role in a receiver. For example, integrated transformer 202 is connected to input pins of LNT circuit 200 so that transformer noise undesirably adds noise to an input signal, thereby degrading the NF. To reduce losses, integrated transformer 202 can have a coupling coefficient relatively close to unity and a relatively high quality factor Q to reduce its intrinsic noise. To maximize the coupling coefficient of integrated transformer 202 (302), primary coil 204 (310) and secondary coils 206 (306) and 208 (308) are overlapped. However, when only one relatively thick metal layer is used in the construction of integrated transformer 202, overlapped coils can compromise the quality factor Q of one of the coils. In the case of a simple transformer, independently of the current gain, the primary and secondary coils contribute equally to overall transformer noise. Thus, a stacked transformer design can lead to deteriorated performance of one of the two windings. However, in the case of an LNT (e.g., LNT 104), when the impedances of the windings of the coils are much greater than the driving and loading impedances of the coils, a noise transfer function associated with the primary coil can be used to determine a transformer design that produces relatively low noise. Such a transformer includes a primary coil comprising thick copper metal and a secondary coil comprising aluminum pad (AP) metal (due to its minor impact on the overall noise of the transformer). For example, AP metal has a conductibility that is lower than ultra-thick metal (UTM). Accordingly, noise associated with a coil made from AP metal can be greater than a comparable coil made from UTM.

When an additional coil is used (e.g., in addition to one primary coil and one secondary coil), as in the case of the LNT circuits 200 or 300, it is not desirable to use three layer stacking (e.g., to have both secondary coils symmetric to each other and to have a maximum quality factor Q), since a bottom metal eventually used in the stack would impose an undesirable amount of series resistance. The two secondary coils (e.g., 206/208 or 306/308) are thus realized on the same plane using an AP metal while the boosting coil comprises a relatively thick copper layer as the primary coil. The transformer coils do not need to have more than 2 or 3 turns to avoid a large number of crosses that can degrade the overall quality factor Q.

In various embodiments, considering constraints and issues described above (e.g., NF versus power trade-off, etc.), a transformer ratio for LNT circuit 300 is 2:1 (high linearity zone). For LNT circuit 200, a transformer ratio is about 3:1 (low noise zone). For a 2:1 transformer, primary coil 204 has two turns. This is because two secondary coils 206 and 208 can be obtained using almost the same shape as primary coil 204, changing only a metal layer and the position of the layout cross between them. Such a cross can be defined by a coil having two turns on a single plane and being almost symmetric at some point, so that wire can pass over or under the other half of the wire of the turns. Unfortunately, since in this case secondary coils 206 and 208 have a center tap to provide power and ground connections, a symmetrical structure demands two crosses instead of one. To maximize coupling and to minimize the number of crosses, positions of the crosses are the same for both primary coil 204 and secondary coils 206 and 208. This configuration can be obtained by rotating the input (primary) coil by 90 degrees with respect to the output (secondary) coils. Using such a configuration, an exact 2:1 ratio is obtained, taking advantage of the constructive mutual inductance between the coils. For a third secondary coil, such as secondary coil 304 in integrated transformer 302, a concentric spiral winding can be used. To obtain a ratio of at least approximately 1:1, secondary coil 304 is placed so that one turn is inside and one turn is outside primary coil 310.

In some implementations, a transfer function of integrated transformer 202 of LNT circuit 200 can have a notch (e.g., an amplitude dip in a frequency output/input response curve) due to a coupling capacitor between primary coil 204 and secondary coils 206 and 208. Similarly, a transfer function of integrated transformer 302 of LNT circuit 300 can have a notch (e.g., an amplitude dip in a response curve) due to a coupling capacitor between primary coil 310 and secondary coils 306 and 308. These notches occur at the particular frequency for which the capacitor current and the induced current cancel out. The frequency where the notch occurs can be adjusted by adding an explicit capacitance between primary coil and secondary coils. Tuning the position of the notch allows for filtering out the 3rd harmonic of an input signal, thereby improving (e.g., by more than 30 dB, in some implementations) harmonic rejection.

Figure 5:
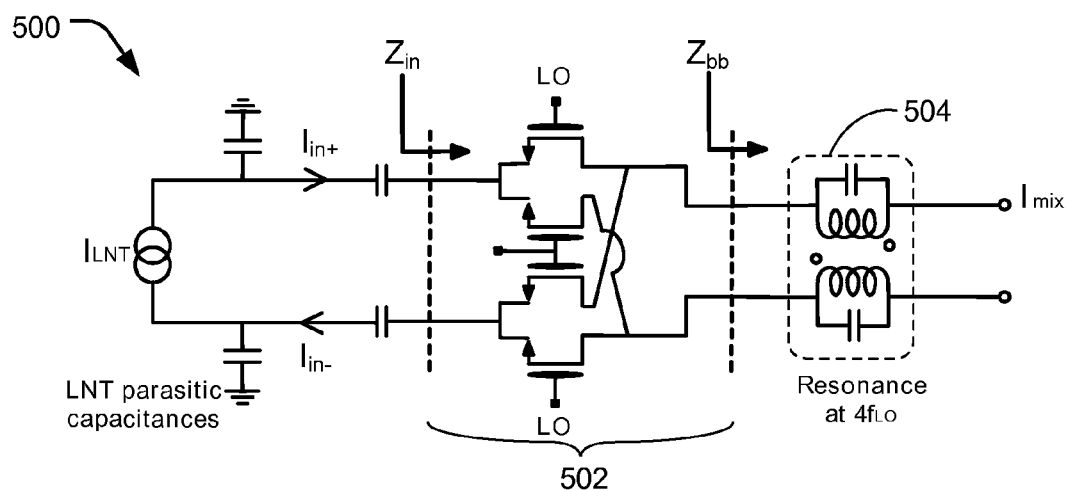
FIG. 5 is a schematic diagram of the circuit of a transceiver, including a resonant mixer, according to various embodiments.

FIG. 5 is a schematic diagram of a circuit of a resonant mixer 500 of a transceiver, according to various embodiments. Resonant mixer 500, which corresponds to resonant mixer block diagram 106 shown in FIG. 1, receives a current $I_{LNT}$ from an LNT (e.g., LNT 104) and provides a modified current $I_{mix}$ to a base band (e.g., 108). Resonant mixer 500 combines symmetric local oscillator frequencies, $f_{LO+}$, and $f_{LO-}$, with frequencies included in $I_{LNT}$, with the aim to move the RF input signal to a base-band signal. A current-mode passive mixer 502 is combined in series with an inductor-capacitor (LC) tank 504 that resonates at the 4th harmonic of the local oscillator ($4f_{LO}$). The impedance $Z_{bb}$ of LC tank 504 is reflected at the input of passive mixer 502 and shifted (translated) up and down in frequency by the frequency of the local oscillator (and scaled in value) to $3f_{LO}$ and $5f_{LO}$. The reflection and the shift increase the impedance seen looking into passive mixer 502 around 3rd and 5th harmonics of the local oscillator. Due to this impedance translation mechanism, a current partition between the output impedance of the LNT and input impedance $Z_{in}$ of passive mixer 502 significantly reduces current $I_{in}$ entering passive mixer 502 at the 3rd and the 5th harmonics of the local oscillator, without significantly affecting current at the fundamental frequency of the input signal. This leads to an improvement in the overall harmonic rejection of the RF front-end of the transceiver.

Figure 6:
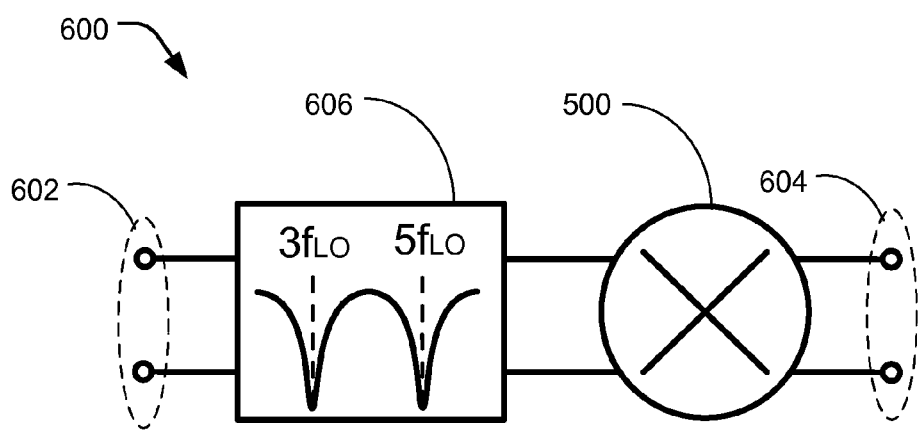
FIG. 6 is a block diagram representation of resonant mixer, according to some embodiments.

FIG. 6 is a block diagram representation 600 of resonant mixer 500 shown in FIG. 5, according to some embodiments. Terminals 602 can be connected to an LNT (e.g., LNT 104) to receive a current $I_{LNT}$ from the LNT. Terminals 604 are connected to a base band module (e.g., base band module 108) to provide a current $I_{mix}$ to the base band module. Block 606 represents notches in the frequency response of the input to resonant mixer 500 at the 3rd and 5th harmonics of the local oscillator frequency.

Figure 7:
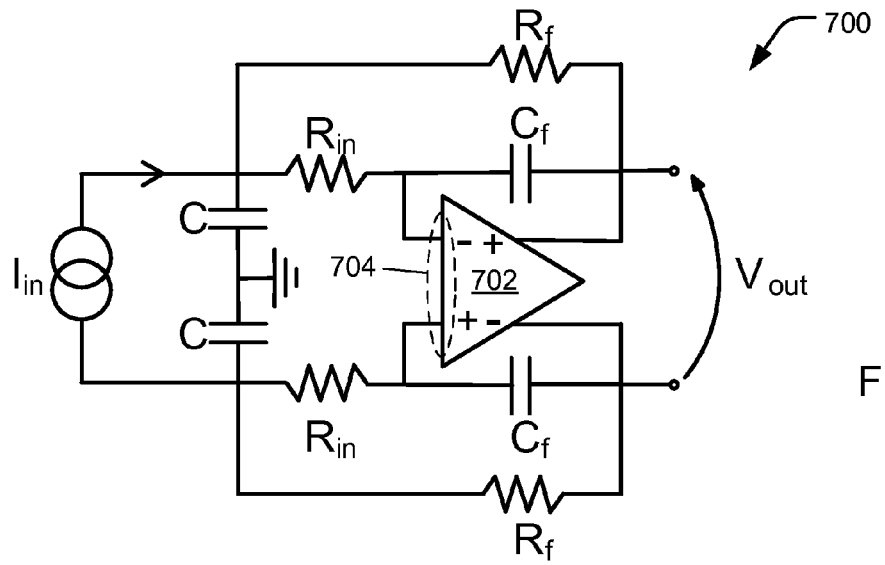
FIG. 7 is a schematic diagram of a circuit of a base band module of a transceiver that does not include a SAW filter, according to various embodiments.

FIG. 7 is a schematic diagram of a circuit of a base band module 700 of a transceiver that does not include a SAW filter, according to various embodiments. A SAW filter would otherwise provide RF selectivity for out-of-band blockers (e.g., 20 MHz offset in GSM, or TX leakage in UMTS). Accordingly, an absence of such RF selectivity creates a challenging dynamic range requirement for base band module 700. For example, base band module 700 is configured to receive relatively large interferers without increasing a NF of the transceiver. Intermodulation and extra noise tends to increase the NF. A frequency profile of input impedance of base band module 700 represents another design constraint, since the frequency profile can affect operation of the current mode of a receiver chain and operation of the resonant mixer. Therefore, base band module 700 is configured to have relatively low noise, high linearity, and low input impedance over a broadband, while operating with a relatively small power budget (e.g., consuming less than about 30% of the RF section of the transceiver).

In some embodiments, base band module 700 is a current-driven Rauch filter, which can be directly connected between the RF section and the base-band sections of the transceiver, thus avoiding cascaded I-V and V-I stages. Input signal $I_{IN}$ is provided by a resonant mixer, such as resonant mixer 500 shown in FIG. 5. For example, resonant mixer 500 provides an output current $I_{mix}$ at its output terminals. Base band module 700 provides a signal $V_{out}$ at its output terminals from an input current, and so represents a trans-impedance stage. In one implementation, base band module 700 includes a control bit acting on input resistors $R_{in}$ that can be switched so that base band module 700 can be selected to operate in a TDD mode or an FDD mode.

A feedback resistance $R_f$ can be selected to set an in band trans-impedance gain of base band module 700, while the time constants $R_{in}C$ and $R_fC_f$ are selected to set the selectivity of base band module 700. Gain, cut-off frequency, and quality factor Q can experience Process Voltage Temperature (PVT) variations, when no automatic calibration is implemented. However, an opportunity to tune capacitances C and $C_f$ by up to about 30% can be implemented (e.g., by incorporating logic circuitry to operate switches) to compensate for varying PVT and/or to allow cut-off configurability (e.g., changing cut-off frequency).

In some embodiments, dominant noise contributors in base band module 700 are input resistance $R_{in}$ and operational amplifier 702. The noise of the input resistance $R_{in}$ and operational amplifier 702 is high pass shaped (i.e., is reduced in the band of interest). Noise from feedback resistance $R_f$ is not high-pass shaped, but follows a Signal Transfer Function (STF) profile. However, this noise is negligible. There is a trade-off between in-band noise and selectivity, and also a trade-off between in-band noise and input impedance. Widening filter bandwidth increases the amount of noise filtering but reduces interferer attenuation. Furthermore, noise can be reduced by lowering capacitance C and increasing $R_{in}$, though at a cost of higher input impedance.

Linearity of base band module 700 can be improved by increasing Operational Transconductance Amplifier (OTA), open-loop gain at the signal frequency. For example, the higher the OTA gain, the smaller the swing at the virtual ground node of base band module 700, which reduces the amount of non-linear terms, for a given output swing. This can be accomplished with a feed-forward compensated OTA.

Power consumption, non-linearity, and noise of base band module 700 are determined, at least in part, on operational amplifier 702. Linearity can be improved by increasing OTA bandwidth. Using a traditional single pole architecture, a high open-loop unity gain frequency would lead to sufficient gain at frequencies of the blockers (e.g. at 2 MHz). On the other hand, the use of feed-forward compensation can overcome this limitation. A fast low-gain feed-forward path can lead to stability of the structure by determining the OTA frequency. Regarding noise of operational amplifier 702, the input differential pair 704 represents the main OTA noise source. To save power, a complementary p-n MOS architecture with current re-use is incorporated in a first stage, which gives the same equivalent transconductance with about half of the current of a simple p-MOS or n-MOS-only differential pair. For example, since current folding branches of a p-n input stage can consume about 25% of the total input stage current, 40% power saving can be obtained (e.g., about 15% of the total OTA budget).

In various embodiments, the OTA drives a large capacitive load due to a number of reasons. First, satisfying a demanding 1/f noise target of a direct conversion GSM receiver (e.g., 100 Hz lower noise integration edge) mandates use of large input transistors. Combining such transistors with the relatively large feedback capacitance $C_f$ leads to a relatively large parasitic capacitance of the input transistors of the OTA, which loads the output nodes at high frequency. Second, capacitance $C_f$ can have about 5% parasitic to ground at both a top and a bottom plate of the capacitor. Third, some capacitive load amount may be considered for PADs [a capacitive load amount can be considered for pads and off-chip parasitic elements (e.g. soldering, packaging, passive devices, and so on)] together with differential probe input capacitance. Pads can be a portion of aluminum (e.g., having a square or rectangular shape) to which a bond wire can connect. In some implementations, pads are also connected to electro-static discharge (ESD) circuit protection (e.g., diodes), which can have a relatively large parasitic capacitance. It follows that a high OTA power consumption would be required for the system (OTA) stability, since the non-dominant pole of the OTA, which affects stability, is linked to the output capacitance value. For a given OTA target bandwidth and a given capacitive load, to reduce power consumption of the output stage, an Ahuja compensation technique can be used. This gives about 60% current saving by pushing the non-dominant pole at more than twice the OTA frequency (e.g., with about a 60-degrees phase margin), compared with a traditional Miller compensation.

Figure 8:
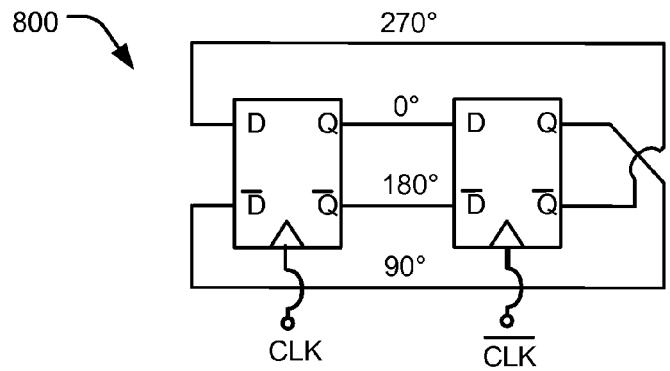
FIG. 8 is a schematic diagram of a flip-flop based circuit divider, generating a 25% duty-cycle clock, according to various embodiments.
Figure 9:
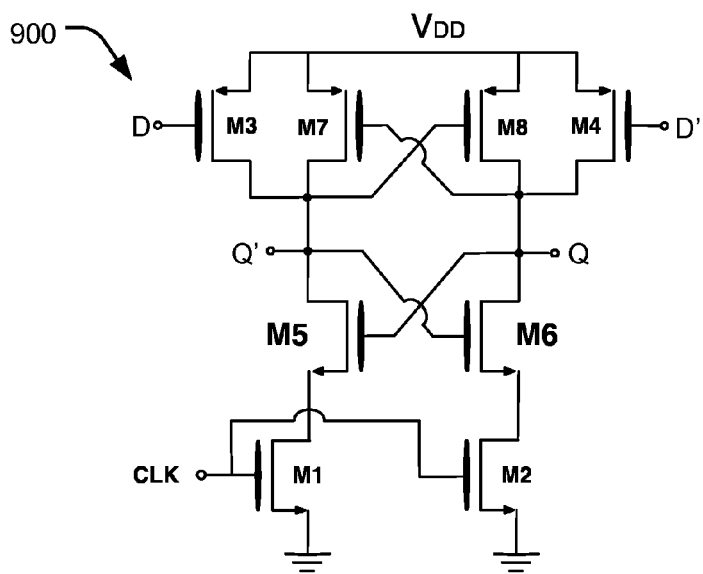
FIG. 9 is a schematic diagram of a particular implementation of flip-flop circuit, to be included in the flip-flop base circuit divider, according to some embodiments.

FIG. 8 is a schematic diagram of a flip-flop based circuit divider (×2) 800 to generate a 25% duty cycle clock, and FIG. 9 is a schematic diagram of a particular implementation of flip-flop circuit, according to some embodiments. A divider circuit can be included in a receiver portion of a transceiver for a number of reasons that arise from eliminating a SAW filter from the transceiver. For example, referring to receiver portion 100 shown in FIG. 1, without a SAW filter before LNT 104, reciprocal mixing can cause significant NF degradation, because any interferer at an input of resonant mixer 106 convolving with phase noise of the local oscillator increases in-band noise proportionally to blocker magnitude. Since the receiver portion 100 tolerates blockers up to 0 dBm starting from a 20 MHz offset, the phase noise of the local oscillator should be lower than −172 dBc/Hz to minimize signal-to-noise degradation. Because of this, when multiple-phase mixers are used in place of SAW filters to satisfy harmonic rejection, generation and distribution of a clock could become the most power hungry section of the receiver. Divider circuit 900 is configured to receive an electromagnetic clock signal and divide it so that the input signal frequency is divided at the output by an integer factor. For example, divider circuit 900 can receive a clock signal (not the TDD-based electromagnetic signal) created by a voltage-controlled oscillator (VCO) on a chip and create a signal that is a sub-multiple in frequency of the clock signal itself (e.g., divided by 2 or 4. In this case the clock signal is divided by 2: the clock frequency starts as 4 GHz and after the divider circuit it is 2 GHz with a 25% duty-cycle). At this point the signal generated by divider circuit 900 can be used to drive resonant mixer 600.

The use of narrowband LNT 104 and resonant mixer 106 can limit the number of phases required to drive I and Q mixers to four. However, to maximize conversion gain and to reduce I-Q interaction, a 25% duty-cycle is used for four clock phases, which are generated directly by the divider circuit 900 so as to avoid the use of a dedicated stage that recombines edges of the signals.

Such a divider circuit generates a 25% duty-cycle output by using a particular latch: when the latch senses an input signal, NMOS pull-down transistors M1-M2 are OFF and both output terminals Q and Q' are high (one pulled up by the input and the other maintaining a high state from the previous cycle). This asymmetry in the latch response gives the 25% duty-cycle output. NMOS pull-down transistors M5-M6 are added in series to NMOS pull-down transistors M1-M2 to eliminate a direct path between $V_{DD}$ and ground. Starting from a substantially noise-free external clock, divider circuit 900 generates a quadrature clock having low phase noise. For example, the quadrature clock may have about −174 dBc/Hz phase noise at 20 MHz while consuming 6 mA at 2 GHz output frequency.

Figure 10:
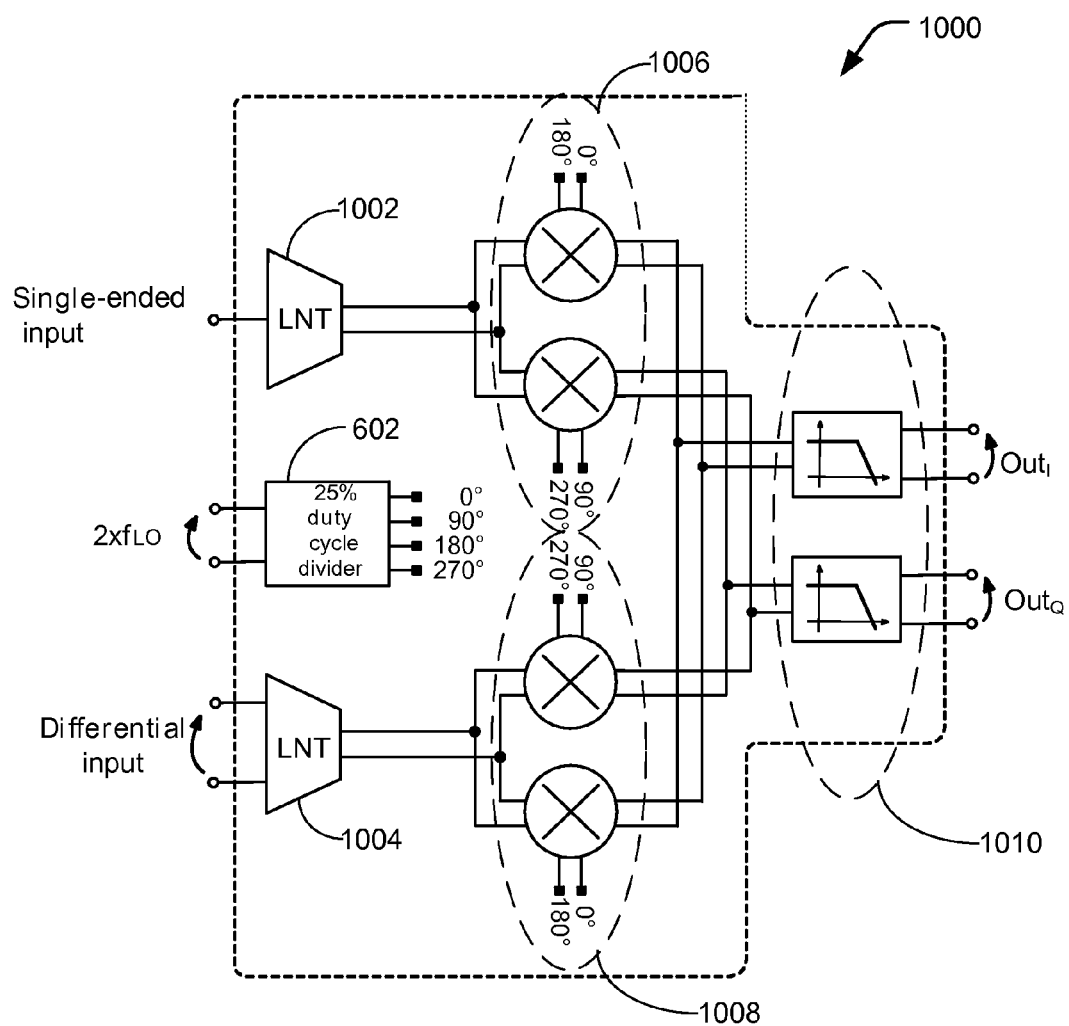
FIG. 10 is a block diagram of a receiver portion of a transceiver that does not include a SAW filter, according to some embodiments.

FIG. 10 is a block diagram of a receiver portion 1000 of a transceiver that does not include a SAW filter, according to some embodiments. Receiver portion 1000 includes a single-ended input LNT 1002 and a differential-input LNT 1004, each capable of receiving RF signals from an antenna, such as antenna 102 shown in FIG. 1. Single-ended input LNT 1002 and differential input LNT 1004 comprise low-noise transconductance class AB common-gate transformers that present low-impedance loads to such an antenna (impedance matching condition). Single-ended input LNT 1002 is configured to receive and process TDD-based RF signals, whereas differential input LNT 1004 is configured to receive and process FDD-based signals. Single-ended input LNT 1002 can be the same or similar to LNT circuit 300, shown in FIG. 3. Differential input LNT 1004 can be the same or similar to LNT circuit 200, shown in FIG. 2.

Receiver portion 1000 also includes a first resonant mixer 1006 configured to receive current output from single-ended input LNT 1002, and a second resonant mixer 1008 configured to receive current output from differential input LNT 1004. First resonant mixer 1006, which can be the same or similar to resonant mixer 500 shown in FIG. 5, provides a modified current to a base band portion 1010 that generates output signals $Out_I$ and $Out_Q$, which are 90° out of phase with respect to each other. Base band portion 1010 can be the same or similar to base band module 700, shown in FIG. 7. Second resonant mixer 1008, which can be the same or similar to resonant mixer 500 shown in FIG. 5, also provides a modified current to base band portion 1010.

It is to be noted that various techniques, operations, processes and methods are described herein. The scope of the present disclosure is intended to cover such techniques, operations, processes and methods through claims currently appended hereto or added in the future.

As used herein, the term "module" or "block" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A receiver comprising:
a low-noise amplifier (LNA) configured to receive an electromagnetic signal, wherein the LNA includes a transformer-based class A/B common gate;
a passive resonant mixer electrically connected to (i) an output port of the transformer and (ii) a local oscillator divider, wherein the passive resonant mixer is configured to reject at least one harmonic of a local oscillator;
a base-band module electrically connected to an output port of the passive resonant mixer, wherein the LNA comprises a single-ended input transformer, and wherein the electromagnetic signal comprises a time-division-duplexing mode electromagnetic signal; and
a single ended/differential input low noise transconductance amplifier (LNT) configured to receive a time/frequency-division-duplexing mode electromagnetic signal.

2. The receiver of claim 1, wherein:
active portions of the single-ended input LNT include the transformer-based class A/B common gate; and
active portions of the differential-input LNT include the transformer-based class A/B common gate.

3. The receiver of claim 1, wherein:
secondary coils of the single-ended input transformer have fewer turns than primary coils of the single-ended input transformer to thereby produce a current gain; and
secondary coils of the differential-input transformer have fewer turns than primary coils of the differential-input transformer to thereby produce a current gain.

4. The receiver of claim 1, wherein the base-band module comprises a Rauch filter.

5. The receiver of claim 1, wherein the transformer is configured to reject a $3^{rd}$ harmonic of the local oscillator.

6. The receiver of claim 1, wherein the passive resonant mixer is combined in series with an LC tank that resonates at a 4th harmonic of the local oscillator.

7. The receiver of claim 1, further comprising a divider circuit configured to (i) receive a two times local oscillator (2×LO) electromagnetic signal and (ii) divide the 2×LO electromagnetic signal in frequency.

8. The receiver of claim 7, wherein the low-power divider circuit is configured to provide a 25% duty cycle divided LO signal.

9. The receiver of claim 1, wherein the single-ended input LNA comprises a balun.

10. A circuit configured to operate on (i) time-division-duplexing-based electromagnetic signals and (ii) frequency-division-duplexing-based electromagnetic signals, wherein the circuit does not include a surface acoustic wave (SAW) amplifier, and wherein the circuit comprises:
a single-ended input low noise amplifier (LNA) configured to receive the time-division-duplexing-based electromagnetic signals;
a differential-input low noise amplifier (LNA) configured to receive the frequency-division-duplexing-based electromagnetic signals;
a first resonant mixer electrically connected to (i) an output port of the single-ended input LNA and (ii) a local oscillator;
a second resonant mixer electrically connected to (i) an output port of the differential-input LNA and (ii) the local oscillator; and
a base-band module electrically connected to (i) an output port of the first resonant mixer and (ii) an output port of the second resonant mixer.

11. The circuit of claim 10, wherein:
active portions of the single-ended input LNA includes a fully differential complementary class A/B common gate; and
active portions of the differential-input LNA includes a fully differential complementary class A/B common gate.

12. The circuit of claim 10, wherein:
secondary coils of the single-ended input transformer have fewer turns than primary coils of the single-ended input transformer to produce a current gain; and
secondary coils of the differential-input transformer have fewer turns than primary coils of the differential-input transformer to produce a current gain.

13. The circuit of claim 10, wherein:
the first resonant mixer is configured to reject (i) a $3^{rd}$ harmonic of the local oscillator and (ii) a $5^{th}$ harmonic of the local oscillator; and
the second resonant mixer is configured to reject (i) the $3^{rd}$ harmonic of the local oscillator and (ii) the $5^{th}$ harmonic of the local oscillator.

14. The circuit of claim 10, wherein:
the first resonant mixer is combined in series with a first inductor-capacitor tank that resonates at a 4th harmonic of the local oscillator; and
the second resonant mixer is combined in series with a second inductor-capacitor tank that resonates at the 4th harmonic of the local oscillator.

15. The circuit of claim 10, further comprising a low-power divider circuit to (i) receive the LO electromagnetic signal and (ii) divide a two times local oscillator (2×LO) electromagnetic signal, wherein the low-power divider circuit is configured to provide the 2× divided LO at a 25% duty cycle.

16. A receiver comprising:
a low-noise amplifier (LNA) configured to receive a time-division-duplexing mode electromagnetic signal, wherein the LNA comprises a single-ended input transformer;

a single ended/differential input low noise transconductance amplifier (LNT) configured to receive a time/frequency-division-duplexing mode electromagnetic signal;

a passive resonant mixer electrically connected to (i) an output port of the transformer and (ii) a local oscillator divider, wherein the passive resonant mixer is configured to reject at least one harmonic of a local oscillator; and a base-band module electrically connected to an output port of the passive resonant mixer.

17. The receiver of claim 16, wherein the base-band module comprises a Rauch filter.

* * * * *